United States Patent [19]

Paulinski

[11] 4,082,218
[45] Apr. 4, 1978

[54] POTENTIAL FAILURE DETECTING CIRCUIT HAVING IMPROVED MEANS FOR DETECTING TRANSITIONS IN SHORT DURATION SIGNALS

[75] Inventor: Ronald Adam Paulinski, Goleta, Calif.

[73] Assignee: Burroughs Corporation, Detroit, Mich.

[21] Appl. No.: 754,429

[22] Filed: Dec. 27, 1976

[51] Int. Cl.² .......................................... G06F 11/00
[52] U.S. Cl. ............................. 235/304; 235/302.2; 340/146.1 R
[58] Field of Search ............ 340/146.1 R; 235/153 A, 235/153 R, 304, 302.2; 325/42, 323; 328/108, 111; 329/104, 106; 307/231, 234

[56] References Cited

U.S. PATENT DOCUMENTS

| | | | |
|---|---|---|---|
| 3,386,079 | 5/1968 | Wiggins | 340/146.1 R |
| 3,398,369 | 8/1968 | Brothman et al. | 340/146.1 R |
| 3,548,176 | 12/1970 | Shutler | 235/153 A |
| 3,548,177 | 12/1970 | Hartlipp et al. | 235/153 A |
| 3,548,178 | 12/1970 | Carnevale et al. | 235/153 A |
| 4,032,884 | 6/1977 | Gutleber | 325/323 |
| 4,034,340 | 7/1977 | Sant'Agostino | 325/323 |

*Primary Examiner*—Charles E. Atkinson
*Attorney, Agent, or Firm*—Nathan Cass; Kevin R. Peterson; Edward J. Feeney, Jr.

[57] ABSTRACT

A circuit useful for detecting transitions occurring in a relatively short duration input signal applied to a clocked digital circuit in order to determine whether the input signal is stable over a predetermined minimum time period relative to the clock. In a preferred embodiment, the transitions are detected by taking advantage of the inherent delays occurring as the signal propagates through predetermined circuit components.

10 Claims, 4 Drawing Figures

POTENTIAL FAILURE DETECTING CIRCUIT HAVING IMPROVED MEANS FOR DETECTING TRANSITIONS IN SHORT DURATION SIGNALS

CROSS REFERENCE TO RELATED APPLICATION

Means and Methods For Detecting the Possibility of a Failure Occurring in the Operation of a Digital Circuit, Ser. No. 754,311, filed Dec. 27, 1976.

BACKGROUND OF THE INVENTION

This invention relates generally to improved means and methods for improving the reliability of operation of digital circuits such as employed in digital data processing systems, and more particularly to the provision of improved circuit means for use therewith.

As data processing systems continue to proliferate in our modern society, it is becoming of increasing importance to provide greater reliability of operation of such data processing systems. While there is considerable current effort to provide improved techniques for diagnosing operating failures after they have occurred, much less attention is being given to the problem of determining how circuits and systems should be designed and tested in the first instance so as to reduce if not eliminate the possibility of the occurrence of such operating failures. Also, there is a need for improved circuit means for implementing diagnostic and testing means, particularly where high speed circuitry is to be tested.

SUMMARY OF THE PRESENT INVENTION

Accordingly, it is the broad object of the present invention to provide improved means and methods useful in providing digital data processing systems having greater reliability.

Another object of the present invention is to provide improved means useful for detecting the possibility of a failure occurring in the operation of a high speed digital circuit when incorporated in a digital data processing system.

An additional object in accordance with the foregoing objects is to provide for the detection of the possibility of a failure occurring in the performance of a high speed digital circuit even though the digital circuit is not structurally defective.

A further object of the invention in accordance with the foregoing objects is to provide for the detection of the possibility of a failure occurring in the performance of a high speed digital circuit contained in a digital data processing system even though no failure has occurred in the operation of the system and/or in the operation of the digital circuit.

A more specific object of the present invention is to provide improved circuit means for use in accomplishing the foregoing objects which more advantageously provides for detecting transitions occurring in short duration signals.

A further object of the present invention is to provide improved circuit means for detecting a potential failure in the operation of a high speed digital circuit during normal operation of the system and in the absence of any failure.

Briefly, detection of a potential failure in a high speed digital data system in accordance with a preferred embodiment in which the invention is incorporated may be provided as follows. First, provision is made for operating the system in a normal manner. If a failure is detected, any of a variety of known diagnosing techniques may be employed to eliminate the cause of the failure, such as for example testing one or more of the digital circuits contained in the system for the presence of a defect. If no failure is detected, the preferred embodiment then provides for the testing of one or more digital circuits under actual operating conditions to determine whether the circuit is being operated in the system in a manner which would violate one or more predetermined operating criteria established for the circuit, such as, for example, one or more of the operating criteria provided by the manufacturer of the circuit.

In the preferred embodiment exemplified herein, a clocked digital circuit responsive to the trailing edge of the clock is selected for testing and particular operating criteria thereof are selected to be tested in order to detect the possibility of the occurrence of a failure in the operation of the circuit. The selected operating criteria for the preferred embodiment are that: (1) the digital input signal applied to the circuit be stable for a predetermined minimum time period prior to the occurrence of the trailing edge of the clock and (2) the input signal remain stable for a predetermined time period subsequent to the occurrence of the trailing edge of the clock. If either of these two criteria are violated during actual operation of the digital circuit under test, it is considered an indication of a potential failure in the performance of the circuit, even though no failure has occurred or is currently occurring.

The rationale for the above approach to potential failure detection of a digital circuit will become evident by recognizing that production versions of a data processing system may contain digital circuits having different operating tolerances and safety factors from those employed in the production prototype as well as being intended for use in different operating environments. Thus, successful performance of a digital circuit in a production prototype model is no guarantee that a like digital circuit will successfully perform in a similar manner in production units. The preferred embodiment is accordingly a most desirable way of detecting a potential failure possibility of a digital circuit in a data processing system by providing for the determination of whether predetermined criteria are being met during actual operation of the system even though no failure has occurred or is presently occurring. It will be understood that the predetermined criteria may typically be chosen based on a determination of predicted characteristics of each signal being tested which will be considered as acceptable in order to obtain reliable operation of the circuit under worst case conditions.

A preferred embodiment of the present invention will now be described by illustrating its incorporation in a potential failure detecting circuit useful with high speed digital circuits which takes advantage of inherent circuit delays to provide signals indicating the occurrence of transitions in a relatively short duration input signal for comparison with a "window" representative of the previously mentioned criteria applicable to the circuit being tested.

The specific nature of the invention as well as other objects, features, advantages and uses thereof will become apparent from the following description of a preferred embodiment and the accompanying drawings.

BRIEF DESCRIPTION OF THE DRAWINGS

Like numerals and characters designate like elements throughout the drawings.

Figure 1:
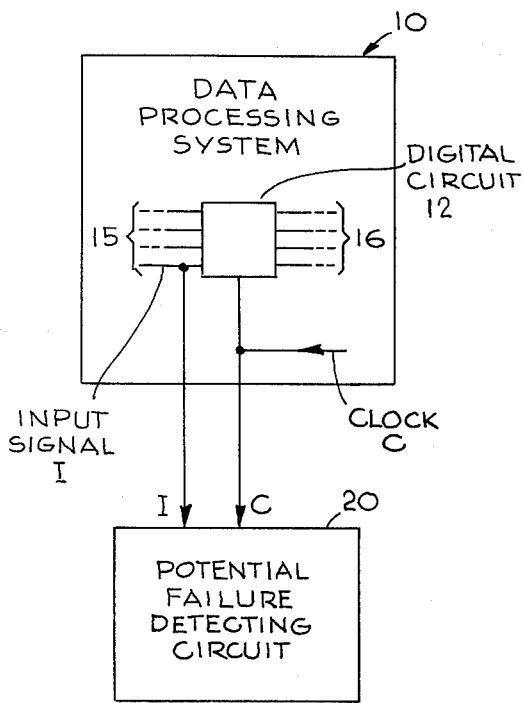
FIG. 1 is an overall block diagram illustrating how a potential failure detecting circuit may typically be employed in conjunction with a data processing system.

Referring initially to the overall block diagram of FIG. 1, a typical data processing system 10 is shown including, for example, a digital circuit 12 having a plurality of input and output lines indicated generally by numbers 15 and 16. For the purposes of this description it will be assumed that the digital circuit 16 receives a digital input signal I on input line 15a, and that the circuit 12 is designed to respond to this input signal I in response to the trailing edge of a clock C also applied to the circuit 12, as shown.

The particular construction and operation of the digital circuit 12 generally shown in FIG. 1 may be provided in many ways, but since such details are not necessary to a full and complete understanding of the invention, they are not shown. For the purposes of the present invention, it will be sufficient for the preferred embodiment of the invention being considered to assume that the predetermined criteria which the input signal I should meet with respect to the digital circuit 12 are that the input signal be stable for at least a predetermined time period T beginning at a predetermined time $t_1$ prior to the occurrence of the trailing edge of the clock C, and terminating at a predetermined time $t_2$ subsequent to the trailing edge of the clock C.

Still with reference to FIG. 1, a potential failure detecting circuit 20 is provided in accordance with the invention for detecting the possibility of a potential failure during actual operation of the digital circuit 12 in the data processing system 10 when no failure has occurred. For the purpose of the preferred embodiment being considered herein, the input line 15a to which the digital input signal I is applied is connected to the potential failure detecting circuit 20 along with the clock C during normal operation of the data processing system 10. It will be understood that, depending upon the particular criteria chosen to be tested by the potential failure detecting circuit 20, any particular desired combination of the digital circuit input and output lines 15 and 16 may be selected for connection to the detecting circuit 20. It will also be understood that such connections may typically be provided in the case of an integrated circuit chip using a conventional form of chip clip. Alternatively, the potential failure detecting circuit 20 could be designed into an integrated circuit chip containing the digital circuit 20.

Figure 2:
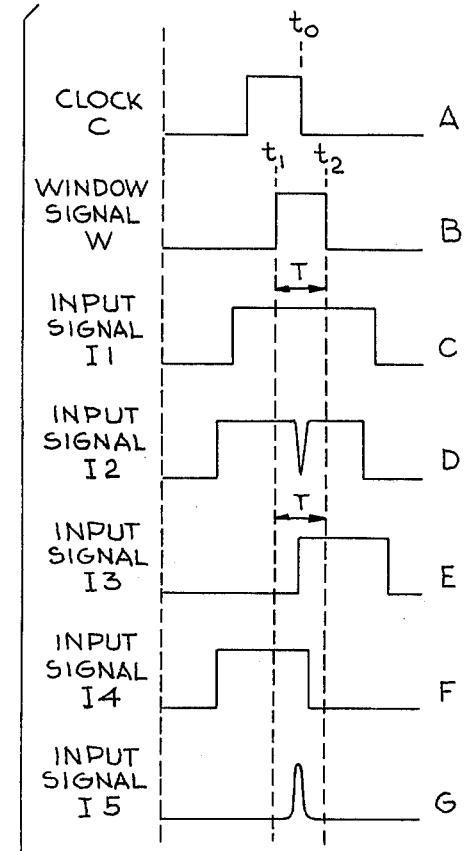
FIG. 2 is a plurality of idealized timing graphs basically illustrating the manner in which a potential failure is detected in a preferred embodiment.
Figure 3:
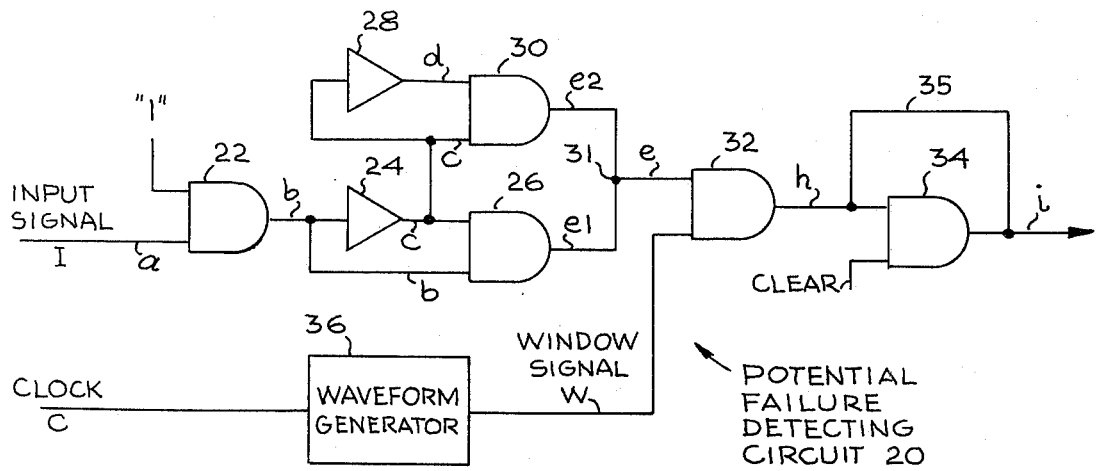
FIG. 3 is an electrical circuit diagram illustrating a preferred embodiment of a potential failure detecting circuit in accordance with the invention.

Reference is now additionally directed to the timing graphs of FIG. 2 which will be used to describe the basic approach employed by the preferred embodiment of the potential failure detecting circuit 20 illustrated in FIG. 3 for providing a detection of the possibility of a potential failure in the operation of the digital circuit 12 of FIG. 1 based upon the input signal I and clock C applied thereto. It is to be understood that the graphs in FIG. 2 are idealized in that signal level changes are shown as vertical transitions so that actual rise and fall times are not shown. This is done in order to permit a simpler and clearer explanation of the invention and those skilled in the art will readily be able to accommodate actual rise and fall times in practicing the invention from the description provided herein.

Graph A in FIG. 2 illustrates a typical device clock C which will be seen to have a trailing edge occurring at a time designated as $t_0$. As mentioned previously, it is assumed that the digital circuit 12 of the system of FIG. 1 which is being tested for potential failure is responsive to the trailing edge of the clock C.

Graph B in FIG. 2 illustrates a window signal W generated by the potential failure detecting circuit 20 of FIG. 3 for use in determining whether an input signal I (such as typically illustrated in graphs C-F in FIG. 2) meets the established criteria relative to the clock C. The window signal W in graph C is chosen so as to be at a true or "1" logical level for a time period T beginning at a time $t_1$ prior to the trailing edge of the clock and terminating at a time $t_2$ subsequent to time $t_0$, thereby establishing predetermined timing criteria relative to the clock C which must be met by an input signal I applied to the digital circuit 12 in FIG. 1.

It will thus now be evident that graph C in FIG. 2 illustrates the situation of an applied input signal I1 which meets the timing criteria relative to the clock C established by the window signal W of FIG. 2, since it is stable over a time period prior to $t_1$ and subsequent to $t_2$. It thus may be concluded that the input signal is not such as to indicate a potential failure situation with regard to the digital circuit 12. To fortify this conclusion, the system 10 containing the digital circuit 12 could be operated under worst case conditions to determine whether the established criteria still remain unviolated.

Graphs D, E, F and G in FIG. 2 will be understood to illustrate various types of signals I2, I3, I4 and I5 which might occur on input line 15a in FIG. 1 which violate the criteria established by the window signal W of graph B, since each has a transition occurring between $t_1$ and $t_2$. Graphs D, E and F illustrate possible input signals which might occur, while graph G illustrates a noise pulse occurring during the window signal period T. Thus, not only does the present invention make it possible to detect potentially faulty input signals, but also permits detecting the possibility of a potential failure or error occurring because of a noise signal occurring during the window signal period T.

Having described the basic approach of the preferred embodiment, the specific manner in which a relatively short duration input signal I of, for example, 30 nanoseconds width, may be tested to determine whether it violates established criteria will now be considered with reference to FIG. 3 which illustrates a particularly advantageous embodiment of the potential failure detecting circuit shown in block form in FIG. 1. Additional reference will also be made to the timing graphs of FIG. 4 for greater ease of understanding. It will be noted that the graphs in FIG. 4 have been given a-i designations corresponding to like designations given to the outputs of pertinent components in FIG. 3 so that the nature of the output signal from each such component output can be readily understood from the corresponding graph in FIG. 4.

Figure 4:
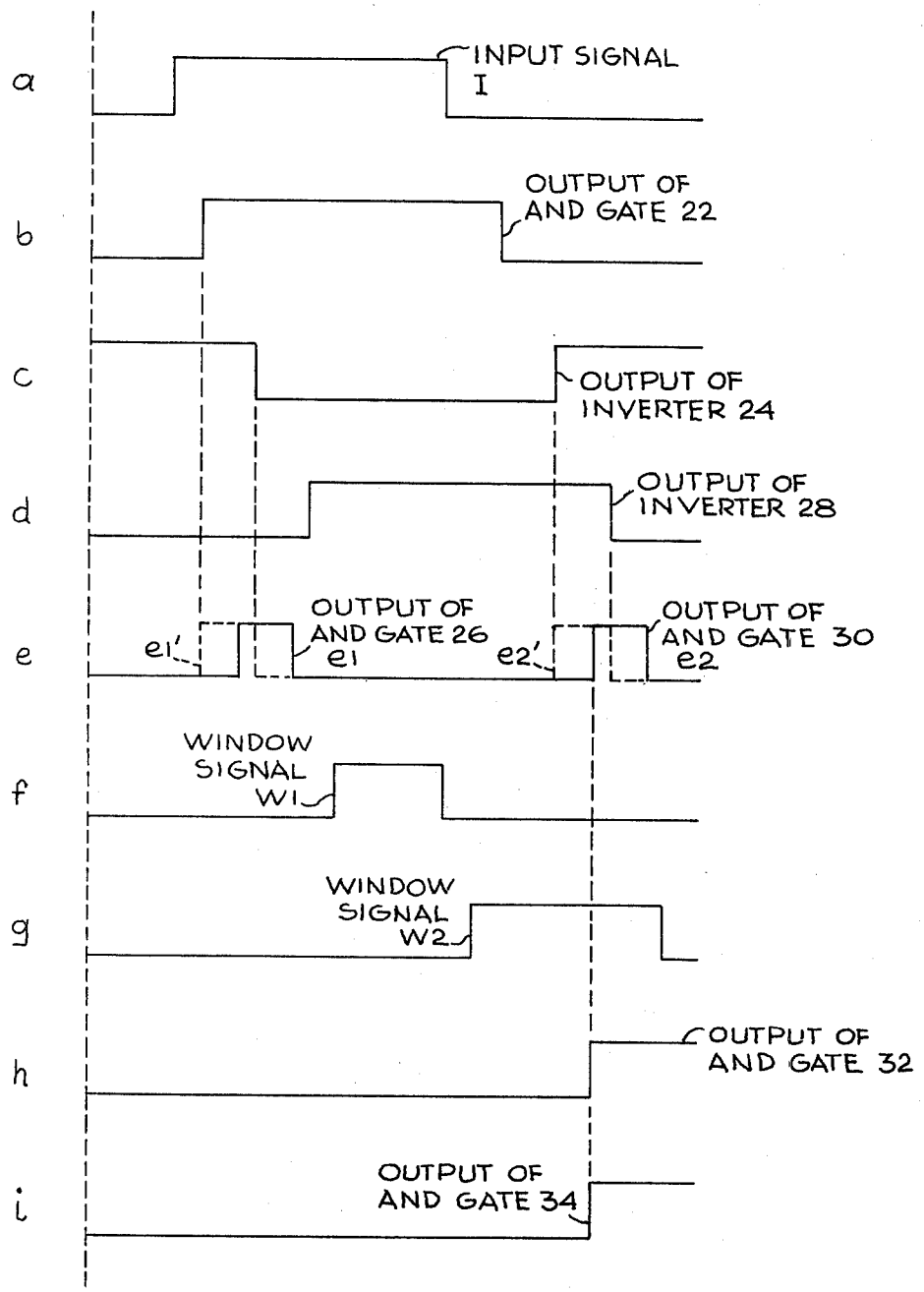
FIG. 4 is a series of idealized timing graphs illustrating the operation of the circuit of FIG. 2.

As shown in the preferred embodiment of the potential failure detecting circuit illustrated in FIG. 3, an input signal I of typically 30 nanoseconds width, such as illustrated in graph a of FIG. 4, is applied to one input of a dual input AND gate 22 having a high input impedance, the other input of AND gate 22 being maintained at a true or "1" level. AND gate 22 thus serves to provide an output signal (graph b in FIG. 4) comprised of the input signal I delayed by an amount equal to the propagation delay through AND gate 22, which may typically be 3 nanoseconds. AND gate 22 may typically be provided using a Fairchild 9863 CTL integrated circuit chip.

The delayed input signal b appearing at the output of AND gate 22 in FIG. 3 is applied to a first inverter 24 and also to one input of an AND gate 26. The output c of AND gate 26 is in turn applied to one input of an AND gate 30, to a second inverter 28, and to one input of an AND gate 30. The output d of the second inverter 28 is applied to the other input of AND gate 30.

Thus, AND gate 26 in FIG. 3 has signals b and c applied thereto so as to produce an output e1 constituting the logical product b·c and representing the leading edge transition of the input signal I (graph a), while AND gate 30 has signals c and d applied thereto so as to produce an output e2 constituting the logic product c·d and representing the trailing edge transition of the input signal I. Graph e in FIG. 4 illustrates the resulting transition signals e1 and e2 appearing at the outputs of AND gates 26 and 30, respectively, taking into account the propagation delays therethrough, which may typically be 5 nanoseconds. The resulting logical sum of e1 and e2 is the signal e which appears at the junction 31 in FIG. 3. For ease of understanding, dashed line signals e1' and e2' are also included in graph e in FIG. 4 in order to illustrate what the locations of e1 and e2 would be if the propagation delay provided by their respective AND gates 30 and 32 were not taken into account. It should thus now be evident how the inherent propagation delays provided by inverters 24 and 28 are advantageously employed to produce transition signals such as e1 and e2 for indicating one or more transitions (either positive-going or negative-going) occurring in a signal on input line 15a in FIG. 1.

Inverters 24 and 28 in FIG. 3 may typically be provided using a Fairchild integrated circuit chip. AND gates 26 and 30 (as well as AND gates 32 and 34 to be considered hereinafter) may typically be provided using a Fairchild CTL 9856 integrated circuit chip.

Still with reference to FIG. 3, the resulting transition signal e at junction 31 is applied to one input of AND gate 32 and a window signal W (such as typically illustrated in graphs f and g in FIG. 4) is applied to the other input of AND gate 32. The window signal W may be provided in any appropriate manner in order to establish the desired timing criteria relative to the clock signal C (as previously described in connection with FIG. 2) taking into account the phase shift in the resulting transition signals e1 and e2. For example, as illustrated in FIG. 3, the window signal W may readily be derived by applying the clock C to a conventional waveform generator 36 for producing a window signal W having the desired period T and location.

Still with reference to FIG. 3 along with the graphs of FIG. 4, it will be understood that the resulting output h from AND gate 32 will become true or "1" only if a transition signal such as e1 or e2 occurs during the window signal time period. For example, it will be understood that for a window signal W1, such as illustrated in graph f in FIG. 4, the transition signals e1 and e2 do not occur during the window signal period so that output h from AND gate 32 remains false or "0." However, for a window signal W2, such as illustrated in graph g in FIG. 4, the transition signal e2 occurs during the window signal period thereby producing the output signal h illustrated in graph h of FIG. 4.

The output h of AND gate 32 is applied to one input of an AND gate 34 which has its output i connected back thereto in order to permit AND gate 34 to operate as a latch in a well known manner. The other input to AND gate 34 has a clear signal applied thereto which is normally maintained true or "1," but is capable of being momentarily switched false or "0" in order to clear the latch, again as is well known in the art. It will thus be understood that the appearance of a true or "1" signal on output h as a result of the detection of a transition occurring during the window signal period will latch AND gate 35, such as illustrated in graph i of FIG. 4, thereby providing an indication of the occurrence of a potential failure, which indication will be held by the latch until cleared.

It is to be understood that the present invention is not limited to the preferred embodiments disclosed herein, and that many modifications in construction, arrangement, use and operation are possible within the true spirit of the invention. The present invention is accordingly to be considered as including all such modifications and variations coming within the scope of the appended claims.

I claim:

1. Potential failure detecting means for detecting the possibility of a potential failure occurring in a digital circuit while the circuit is operating in a data processing system in a normal manner without failure, said potential failure detecting means comprising:

means coupled to a communication line provided between said data processing system and said digital circuit for deriving a test signal indicative of a signal communicated between said digital circuit and said system during actual operation of said circuit in said system;

criteria establishing means for generating a potential failure criteria signal indicative of a predetermined time period;

delay means to which said test signal is applied for producing a delayed test signal;

logic means jointly responsive to said test signal and to said delayed test signal for producing an output signal when said test signal and said delayed test signal have a predetermined polarity relationship; and means responsive to said output signal and said criteria signal for indicating whether said output signal occurs during said predetermined time period.

2. The invention in accordance with claim 1, wherein said delay means inverts as well as delays said test signal so as to produce an inverted delayed test signal, and wherein the operation of said logic means and said predetermined polarity relationship are chosen so that said output signal is produced by said logic means in response to said test signal and said inverted delayed test signal having the same polarity.

3. The invention in accordance with claim 2, wherein said delay means is an inverter and wherein said logic means is an AND gate.

4. The invention in accordance with claim 3, wherein said last mentioned means includes a latch which latches in response to said output signal.

5. Means for detecting the occurrence of a transition in either direction in a signal comprising:
- first delay means to which said signal is applied for producing a delayed signal;
- first logic means jointly responsive to said signal and to said delayed signal from said first delay means for producing a first output signal when said signal and said delayed signal have a first predetermined polarity relationship which is chosen so that said first output signal is produced in response to a transition occurring in said signal in a first direction;
- second delay means to which said delayed signal from said first means is applied for producing a further delayed signal; and
- second logic means jointly responsive to said delayed signal from said first delay means and to said further delayed signal from said second delay means for producing a second output signal when said delayed signal and said further delayed signal have a predetermined polarity relationship which is chosen so that said second output signal is produced in response to a transition occurring in said signal in a second direction opposite to said first direction.

6. The invention in accordance with claim 5, wherein each of said first and second delay means inverts as well as delays the respective signal applied thereto, and wherein the operation of said first and second logic means and said predetermined polarity relationship thereof are chosen so that said first and second output signals are produced in response to the signals applied to their respective first and second logic means having the same polarity.

7. The invention in accordance with claim 6, wherein each of said first and second delay means is an inverter and wherein each of said first and second logic means is an AND gate.

8. Potential failure detecting means for detecting the possibility of a potential failure occurring in a digital circuit while the circuit is operating in a data processing system in a normal manner without failure, said potential failure detecting means comprising:
- means coupled to a communication line provided between said data processing system and said digital circuit for deriving a test signal indicative of a signal communicated between said digital circuit and said system during actual operation of said circuit in said system;
- criteria establishing means for generating a potential failure criteria signal indicative of a predetermined time period;
- first delay means to which said test signal is applied for producing a delayed test signal;
- first logic means jointly responsive to said test signal and to said delayed test signal for producing a first output signal when said test signal and said delayed test signal have a first predetermined polarity relationship which is chosen so that said first output signal is produced in response to a transition occurring in said test signal in a first direction;
- second delay means to which said delayed test signal from said first means is applied for producing a further delayed test signal;
- second logic means jointly responsive to said delayed test signal from said first delay means and to said further delayed test signal from said second delay means for producing a second output signal when said delayed signal and said further delayed signal have a predetermined polarity relationship which is chosen so that said second output signal is produced in response to a transition occurring in said signal in a second direction opposite to said first direction; and
- means responsive to said first and second output signals and said criteria signal for indicating whether either output signal occurs during said predetermined period.

9. The invention in accordance with claim 8, wherein each of said first and second delay means inverts as well as delays the respective signal applied thereto, and wherein the operation of said first and second logic means and said predetermined polarity relationship thereof are chosen so that said first and second output signals are produced in response to the signals applied to their respective first and second logic means having the same polarity.

10. The invention in accordance with claim 9, wherein each of said first and second delay means is an inverter and wherein each of said first and second logic means is an AND gate.

* * * * *